(12) United States Patent
Yang et al.

(10) Patent No.: US 10,475,872 B2
(45) Date of Patent: Nov. 12, 2019

(54) DISPLAY DEVICE WITH LIGHT BLOCKING LAYER AND MANUFACTURING METHOD THEREOF

(71) Applicant: LG Display Co., Ltd., Seoul (KR)

(72) Inventors: Heejung Yang, Gyeonggi-do (KR); Hyungtae Kim, Gyeonggi-do (KR); Dongun Jang, Gyeonggi-do (KR); Dongsun Kim, Gyeonggi-do (KR); Wonjoon Ho, Jeollabuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/298,749

(22) Filed: Oct. 20, 2016

(65) Prior Publication Data
US 2017/0117344 A1  Apr. 27, 2017

(30) Foreign Application Priority Data
Oct. 23, 2015 (KR) .................. 10-2015-0147982

(51) Int. Cl.
*H01L 29/08* (2006.01)
*H01L 27/32* (2006.01)
(Continued)

(52) U.S. Cl.
CPC ....... *H01L 27/3272* (2013.01); *G09G 3/3233* (2013.01); *G09G 2300/0842* (2013.01); *G09G 2320/0295* (2013.01); *G09G 2320/0693* (2013.01); *H01L 27/1225* (2013.01); *H01L 27/3213* (2013.01); *H01L 27/3262* (2013.01); *H01L 29/7869* (2013.01);
(Continued)

(58) Field of Classification Search
CPC ............. H01L 27/3272; H01L 27/3213; H01L 27/3262; H01L 27/3265; G09G 3/3233
See application file for complete search history.

(56) References Cited

U.S. PATENT DOCUMENTS

2002/0140343 A1* 10/2002 Hirabayashi ........ H01L 27/3246
  313/493
2003/0025848 A1*  2/2003 Sera .................. G02F 1/136209
  349/43
(Continued)

FOREIGN PATENT DOCUMENTS

JP  2002-236460 A  8/2002
JP  2010-250005 A  11/2010
(Continued)

OTHER PUBLICATIONS

Office Action dated Sep. 14, 2017, issued in corresponding Taiwanese patent application No. 105133772.
(Continued)

*Primary Examiner* — Matthew E. Gordon
(74) *Attorney, Agent, or Firm* — Morgan, Lewis & Bockius LLP

(57) ABSTRACT

Provided are a display device and a method of manufacturing the same. A display device includes: a light blocking layer on a first substrate, a buffer layer on the light blocking layer, a semiconductor layer on the buffer layer, an insulating layer on the semiconductor layer, and a source/drain metal layer positioned on the insulating layer, the source/drain metal layer including a non-overlap region that does not overlap the light blocking layer.

12 Claims, 19 Drawing Sheets

(51) Int. Cl.
*G09G 3/3233* (2016.01)
*H01L 27/12* (2006.01)
*H01L 29/786* (2006.01)

(52) U.S. Cl.
CPC .. *H01L 29/78633* (2013.01); *H01L 2227/323* (2013.01); *H01L 2251/5392* (2013.01)

(56) References Cited

U.S. PATENT DOCUMENTS

| | | | |
|---|---|---|---|
| 2003/0155860 A1* | 8/2003 | Choi | H01L 27/3244 313/498 |
| 2007/0148831 A1 | 6/2007 | Nagata et al. | |
| 2007/0159565 A1* | 7/2007 | Segawa | G02F 1/136209 349/38 |
| 2011/0193076 A1 | 8/2011 | Yun et al. | |
| 2012/0249936 A1 | 10/2012 | Zi et al. | |
| 2012/0287494 A1 | 11/2012 | Takahashi et al. | |
| 2013/0271690 A1 | 10/2013 | Matsukizono | |
| 2014/0048812 A1* | 2/2014 | Nakano | H04N 1/00 257/71 |
| 2015/0062521 A1* | 3/2015 | Son | G02F 1/133345 349/138 |
| 2015/0279917 A1 | 10/2015 | Yang et al. | |

FOREIGN PATENT DOCUMENTS

| | | |
|---|---|---|
| KR | 10-2014-0046794 A | 4/2014 |
| KR | 10-2015-0112101 A | 10/2015 |
| TW | 200725908 A | 7/2007 |
| TW | 200730983 A | 8/2007 |
| TW | 201303465 A | 1/2013 |

OTHER PUBLICATIONS

Taiwanese Office Action dated Feb. 12, 2018, issued in corresponding Taiwanese Patent Application No. 105133772.
Taiwanese Office Action dated Sep. 28, 2018, issued in corresponding Taiwanese Patent Application No. 105133772.
Taiwanese Office Action dated Jan. 17, 2019, issued in corresponding Taiwanese Patent Application No. 105133772.

* cited by examiner (a)    (b)

DISPLAY DEVICE WITH LIGHT BLOCKING LAYER AND MANUFACTURING METHOD THEREOF

CROSS-REFERENCE TO RELATED APPLICATION(S)

This application claims the benefit of Korean Patent Application No. 10-2015-0147982, filed on Oct. 23, 2015, the entire disclosure of which is hereby incorporated by reference herein.

BACKGROUND

1. Technical Field

The present disclosure relates to a display device and a manufacturing method thereof.

2. Discussion of the Related Art

As information technologies have advanced, the market has grown for display devices as a connection medium between users and information. Accordingly, display devices, such as organic light-emitting display devices, liquid crystal displays (LCDs), and plasma display panels (PDPs), have been increasingly used.

A display device includes a display panel including a plurality of subpixels and a driver driving the display panel. The driver includes a scan driver supplying a scan signal (or a gate signal) to a display panel and a data driver supplying a data signal to a display panel.

In the display device, when a scan signal and a data signal are supplied to the subpixels that are arranged in a matrix form, selected subpixels emit light, thus displaying an image. The display device may implement a display panel using an oxide thin film transistor (TFT).

The oxide transistor, however, has unstable negative bias thermal illumination stress (NBTiS) characteristics. To improve this, in a related art, a scheme of inserting a light blocking layer for blocking ambient light into a lower part of the oxide transistor has been proposed. However, the proposed scheme causes a short between the light blocking layer and a source/drain metal layer in a specific region, which needs to be improved.

SUMMARY

Accordingly, the present disclosure is directed to a display device and a manufacturing method thereof that substantially obviate one or more of the problems due to limitations and disadvantages of the related art.

Additional features and advantages will be set forth in the description which follows, and in part will be apparent from the description, or may be learned by practice of the invention. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, there is provided a display device, including: a light blocking layer on a first substrate, a buffer layer on the light blocking layer, a semiconductor layer on the buffer layer, an insulating layer on the semiconductor layer, and a source/drain metal layer positioned on the insulating layer, the source/drain metal layer including a non-overlap region that does not overlap the light blocking layer.

In another aspect, there is provided a method of manufacturing a display device, the method comprising: providing a light blocking layer on a first substrate; providing a buffer layer on the light blocking layer; providing a semiconductor layer on the buffer layer; providing an insulating layer on the semiconductor layer; and providing a source/drain metal layer on the insulating layer, wherein the light blocking layer comprises a non-overlap region in which a portion in which the light blocking layer and the source/drain metal layer overlap is removed.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the disclosure.

Figure 1:
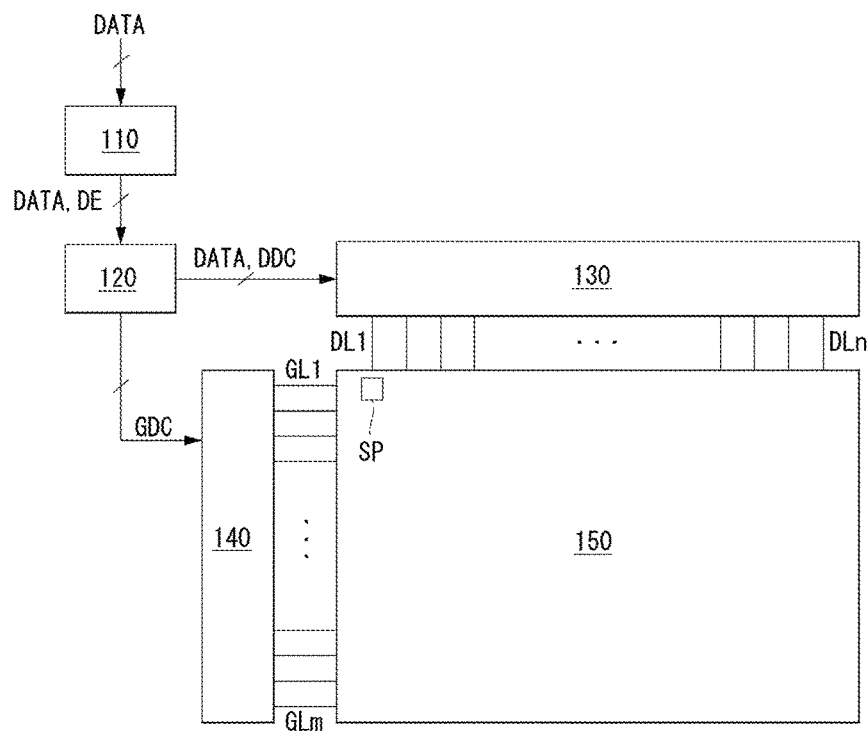
FIG. 1 is a schematic block diagram of an organic light-emitting display device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

A display device according to an example embodiment of the present disclosure may be implemented as a television, a video player, a personal computer, a home theater, and the like. As a display panel of the display device, a liquid crystal display panel, an organic light-emitting display panel, an electrophoretic display panel, a plasma display panel, and the like, may be selectively used, but embodiments are not limited thereto. Hereinafter, an organic light-emitting display device based on an organic light-emitting display panel will be described as an example for purposes of description.

Figure 2:
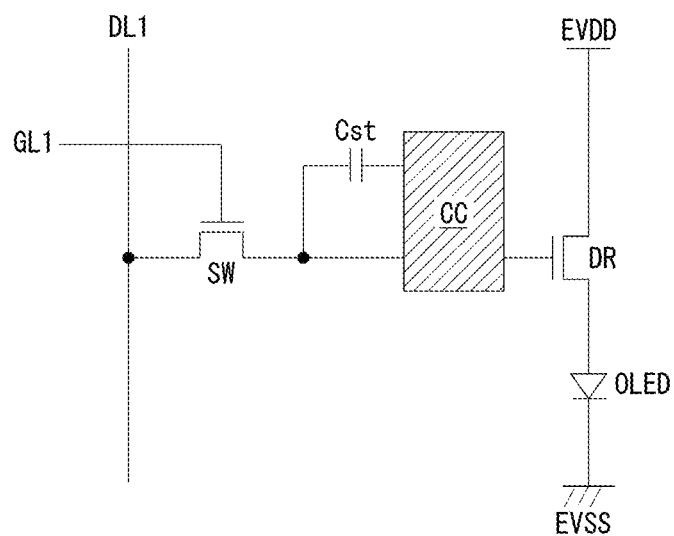
FIG. 2 is a schematic circuit diagram of a subpixel.
Figure 3:
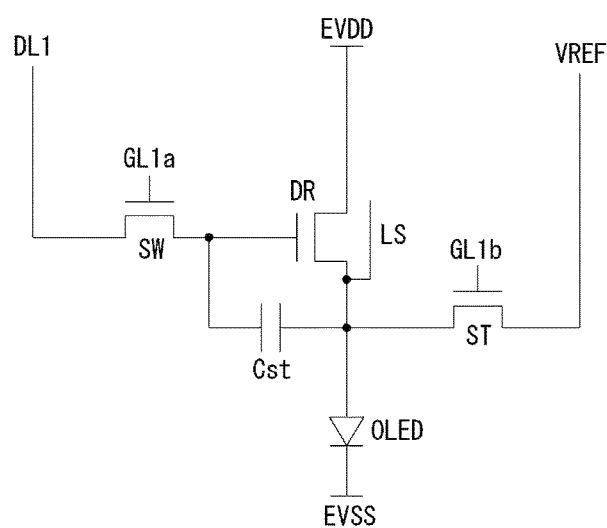
FIG. 3 is a circuit diagram of a subpixel according to an example embodiment of the present disclosure.
Figure 4:
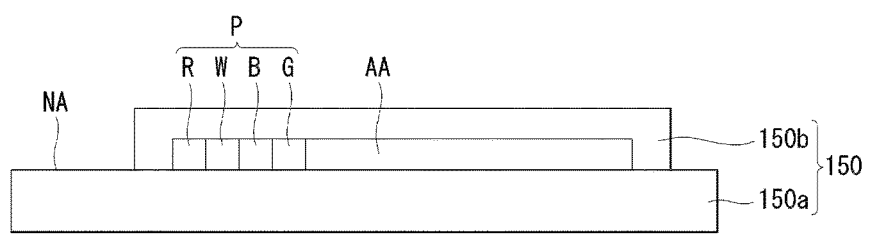
FIG. 4 is a cross-sectional view of a display panel according to an example embodiment of the present disclosure.
Figure 5:
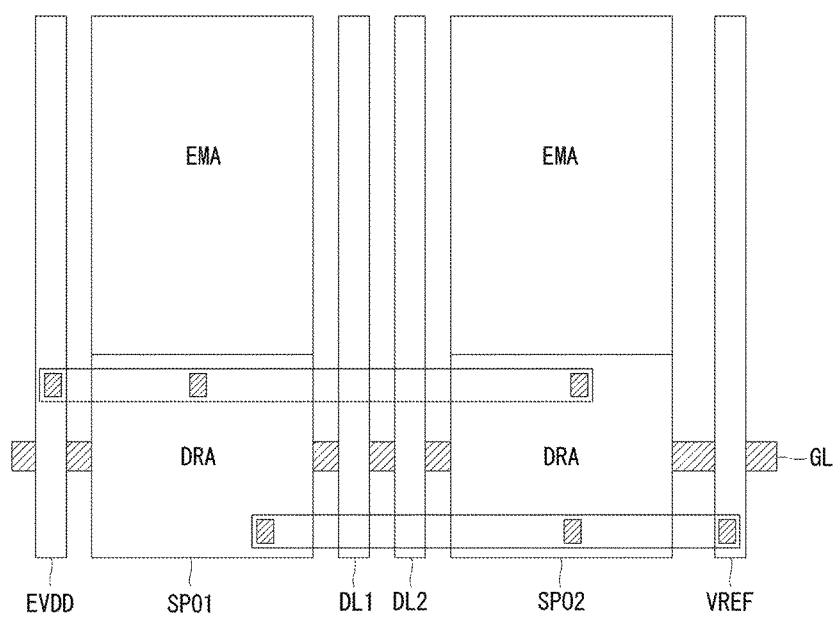
FIG. 5 is a plan view of a subpixel according to an example embodiment of the present disclosure.

FIG. 1 is a schematic block diagram of an organic light-emitting display device according to an example embodiment of the present disclosure. FIG. 2 is a schematic circuit diagram of a subpixel. FIG. 3 is a circuit diagram of a subpixel according to an example embodiment of the present disclosure. FIG. 4 is a cross-sectional view of a display panel according to an example embodiment of the present disclosure. FIG. 5 is a plan view of a subpixel according to an example embodiment of the present disclosure.

As illustrated in FIG. 1, the organic light-emitting display device according to an example embodiment of the present disclosure may include an image processing unit 110, a timing controller 120, a data driver 130, a scan driver 140, and a display panel 150. The image processing unit 110 may output a data enable signal DE together with a data signal DATA supplied from an external source. In addition to the data enable signal DE, the image processing unit 110 may output one or more of a vertical synchronization signal, a horizontal synchronization signal, and a clock signal, but these signals are omitted in the illustrated example for the purposes of description.

The timing controller 120 may receive, from the image processing unit 110, the data enable signal DE, the data signal DATA, and a driving signal, which may include a vertical synchronization signal, a horizontal synchronization signal, a clock signal, and the like. Based on the driving signal, the timing controller 120 may output a gate timing control signal GDC for controlling an operation timing of the scan driver 140 and a data timing control signal DDC for controlling an operation timing of the data driver 130.

In response to the data timing control signal DDC supplied from the timing controller 120, the data driver 130 may sample and latch the data signal DATA supplied from the timing controller to convert the data signal DATA into a gamma reference voltage, and may output the converted gamma reference voltage. The data driver 130 may output the data signal DATA through data lines DL1 to DLn. The data driver 130 may be provided in the form of an integrated circuit (IC).

In response to the gate timing control signal GDC supplied from the timing controller 120, the scan driver 140 may output a scan signal while shifting a level of a gate voltage. The scan driver 140 may output the scan signal through scan lines GL1 to GLm. The scan driver 140 may be provided in the form of an IC or in a gate-in-panel manner in the display panel 150.

In response to the data signal DATA and the scan signal supplied from the data driver 130 and the scan driver 140, the display panel 150 may display an image. The display panel 150 may include subpixels SP that operate to display an image. The subpixels SP may include a red subpixel, a green subpixel, and a blue subpixel, or may include a white subpixel, a red subpixel, a green subpixel, and a blue subpixel. The subpixels SP may have one or more different emission areas according to luminescence properties.

As illustrated in the FIG. 2 example, a single subpixel may include a switching transistor SW, a driving transistor DR, a capacitor Cst, a compensation circuit CC, and an organic light-emitting diode OLED. In response to a scan signal supplied through a first scan line GL1, the switching transistor SW may perform a switching operation such that a data signal supplied through the first data line DL1 may be stored as a data voltage in the capacitor Cst. The driving transistor DR may operate to allow a driving current to flow between a first power line EVDD and a second power line EVSS according to the data voltage stored in the capacitor Cst. The OLED may operate to emit light according to driving currents formed by the driving transistor DR.

The compensation circuit CC may be a circuit added to the interior of the subpixel to compensate for a threshold voltage, or the like, of the driving transistor DR. The compensation circuit CC may include one or more transistors. The compensation circuit CC may be variously configured according to compensation methods, and an example thereof will be described.

As illustrated in the FIG. 3 example, the compensation circuit CC may include a sensing transistor ST and a sensing line VREF. The sensing transistor ST may be connected to a node (hereinafter, referred to as a "sensing node") between a source line of the driving transistor DR and an anode electrode of the OLED. The sensing transistor ST may operate to supply an initialization voltage (or a sensing voltage) transferred through the sensing line VREF to the sensing node, or may sense a voltage or a current of the sensing node.

A first electrode of the switching transistor SW may be connected to the first data line DL1, and a second electrode of the switching transistor SW may be connected to a gate electrode of the driving transistor DR. A first electrode of the driving transistor DR may be connected to the first power line EVDD, and a second electrode of the driving transistor DR may be connected to an anode electrode of the OLED. A first electrode of the capacitor Cst may be connected to a gate electrode of the driving transistor DR, and a second electrode of the capacitor Cst may be connected to the anode electrode of the OLED. The anode electrode of the OLED may be connected to the second electrode of the driving transistor DR, and a cathode electrode of the OLED may be connected to the second power line EVSS. A first electrode of the sensing transistor ST may be connected to the sensing line VREF, and a second electrode of the sensing transistor ST may be connected to the anode electrode of the OLED as a sensing node.

An operation time of the sensing transistor ST may be similar to or the same as that of the switching transistor SW according to compensation algorithms (or configurations of the compensation circuit CC). For example, a gate electrode of the switching transistor SW may be connected to a 1a scan line GL1a, and a gate electrode of the sensing transistor ST may be connected to a 1b scan line GL1b. In another example, the 1a scan line GL1a connected to the gate electrode of the switching transistor SW and 1b scan line GL1b connected to the gate electrode of the sensing transistor ST may be commonly connected to be shared.

The sensing line VREF may be connected to the data driver. In this case, the data driver may sense the sensing node of the subpixel in real time, during a non-display period of an image, or during an N frame (wherein N is a positive integer) period, and may generate a sensing result. The switching transistor SW and the sensing transistor ST may be turned at the same time. In this case, a sensing operation through the sensing line VREF and a data output operation of outputting the data signal may be separately performed based on a time division system of the data driver.

A compensation target according to the sensing result may be a digital data signal, an analog data signal, gamma, or the like. Also, the compensation circuit generating a compensation signal (or a compensation voltage) based on the sensing result may be implemented as an internal circuit of the data driver, as an internal circuit of the timing controller, or as a separate circuit.

A light blocking layer LS may be disposed only below a channel region of the driving transistor DR, or may be disposed below channel regions of the switching transistor SW and the sensing transistor ST, as well as below the channel region of the driving transistor DR. The light blocking layer LS may be used simply for the purpose of blocking ambient light, or may be utilized as an electrode connected to another electrode or line and forming a capacitor, or the like.

In the example of FIG. 3, the subpixel having a 3T1C (3 transistor, 1 capacitor) structure including the switching transistor SW, the driving transistor DR, the capacitor Cst, the organic light-emitting diode (OLED), and the sensing transistor (ST) is illustrated as an example. In an example in which a compensation circuit CC is added, the subpixel may also be configured to have, e.g., a 3T2C, 4T2C, 5T1C, or 6T2C structure.

As illustrated in the FIG. 4 example, a first substrate 150a may include a display area AA and a non-display area NA. Subpixels may be formed in the display area AA of the first substrate 150a based on the circuit described above with reference to FIG. 3. The subpixels formed in the display area AA may be sealed by a protective film (or a protective substrate) 150b. The first substrate 150a may be selectively formed of, e.g., glass or a material having ductility.

The subpixels may be horizontally or vertically disposed in the display area AA, for example, in an order of red (R), white (W), blue (B), and green (G) colors. The subpixels R, W, B, and G may form a single pixel P. However, the disposition order of the subpixels may be variously modified according to emission materials, emission areas, configurations (or structures) of the compensation circuit, and the like. Also, the subpixels R, B, G may form a single pixel P.

As illustrated in the examples of FIGS. 4 and 5, a $01^{st}$ subpixel SP01 and $02^{th}$ subpixel SP02 having an emission area EMA and a circuit area DRA may be formed in the display area AA. The first power line EVDD may be positioned on the left of the $01^{st}$ subpixel SP01, a sensing line VREF may be positioned on the right of the $02^{th}$ subpixel SP02, and first and second data lines DL1 and DL2 may be positioned between the $01^{st}$ subpixel SP01 and the $02^{th}$ subpixel SP02.

The $01^{st}$ subpixel SP01 may be electrically connected to the first power line EVDD positioned on the left thereof, the first data line D1 positioned on the right thereof, and the sensing line VREF positioned on the left of the $02^{th}$ subpixel SP0. The $02^{th}$ subpixel SP02 may be electrically connected to the first power line EVDD positioned on the left of the $01^{st}$ subpixel SP01, the second data line DL2 positioned on the left thereof, and the sensing line VREF positioned on the right thereof. In the $01^{st}$ subpixel SP01 and the $02^{th}$ subpixel SP02, OLEDs positioned in the emission areas EMAs may emit light according to operations of the switching and driving transistors positioned in the circuit areas DRAs.

The organic light-emitting display device may implement a display panel using an oxide transistor TFT. However, the oxide transistor has unstable negative bias thermal illumination stress (NBTiS). Thus, to improve this, in the related art, a scheme of inserting a light blocking layer for blocking ambient light into a portion below the oxide transistor has been proposed. However, this scheme causes a short defect between the light blocking layer and a source/drain metal layer in a specific region, which is, thus, required to be improved.

Hereinafter, an embodiment of the present disclosure to solve the problem of the related art structure will be described.

Figure 6:
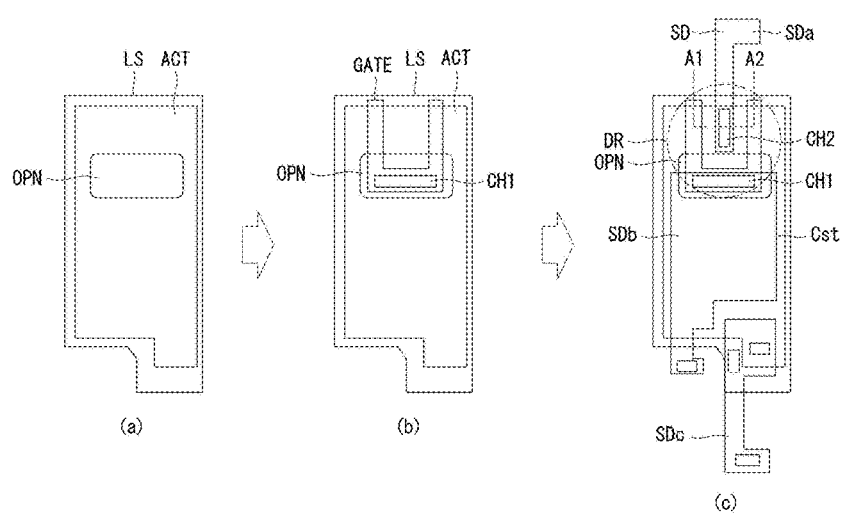
FIG. 6 is a plan view illustrating a circuit region of a subpixel to explain a problem of a related art scheme.
Figure 7:
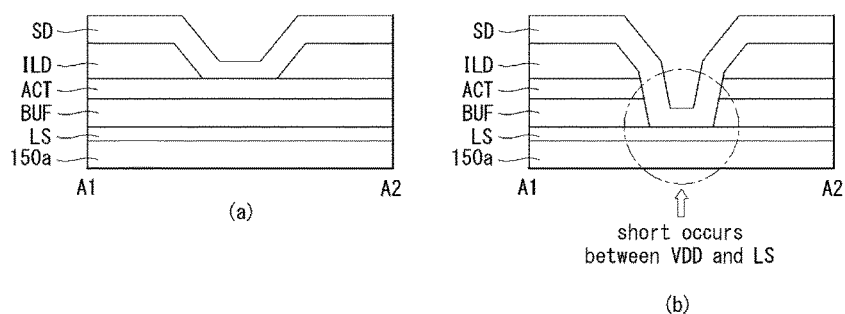
FIG. 7 is a cross-sectional view taken along line A1-A2 of FIG. 6.

FIG. 6 is a plan view illustrating a circuit region of a subpixel to explain a problem of a related art scheme. FIG. 7 is a cross-sectional view taken along line A1-A2 of FIG. 6.

As illustrated in the FIG. 6 example, in the related art, a process of forming a light blocking layer LS, a semiconductor layer ACT, a gate metal layer GATE, and a source/drain metal layer SD on a first substrate may be performed to form a driving transistor DR, a capacitor Cst, etc., within a circuit area. As illustrated in part (a) of FIG. 6, the light blocking layer LS may be formed on the first substrate, a buffer layer BUF may be formed on the light blocking layer LS, and the semiconductor layer ACT may be formed on the buffer layer BUF. The semiconductor layer ACT may include an open part OPN.

As illustrated in part (b) of FIG. 6, a first insulating layer (not shown) may be formed on the semiconductor layer ACT, and a gate metal layer GATE may be formed on the first insulating layer. To form the gate metal layer GATE in the illustrated form, patterning may be performed, an etching process may be subsequently performed, and thereafter, a plasma process may be performed on the semiconductor layer ACT exposed to the periphery of the gate metal layer GATE to make it conductive.

When the process of making the semiconductor layer ACT conductive is performed, the semiconductor layer ACT covered by the gate metal layer GATE may have semiconductor properties, while the semiconductor layer ACT exposed to the marginal portion may have metal properties. A second insulating layer may be formed on the semiconductor layer ACT and the gate metal layer GATE, and a first contact hole CH1 exposing a portion of the gate metal layer GATE may be formed within the open part OPN.

As illustrated in part (c) of FIG. 6, a second contact hole CH2 may be formed on the second insulating layer, and a source/drain metal layer SD may be formed on the second insulating layer. The source/drain metal layer SD may be patterned to be divided by region. The source/drain metal layer SD may be divided into a part SDb connected to the first contact hole CH1 to form a capacitor Cst, a part SDa connected to the second contact hole CH2 to be connected to the first power line, and a part SDc connected to the sensing transistor.

As illustrated in FIG. 7, in the related art structure, when over-etching is made in a process of etching the second insulating layer ILD, a short occurs between the light blocking layer LS and the source/drain metal layer SD. It was determined that the problem arose due to over-etching, an influence of a foreign object, and an interlayer structure. In the following embodiments, this problem is solved as described below.

Figure 8:
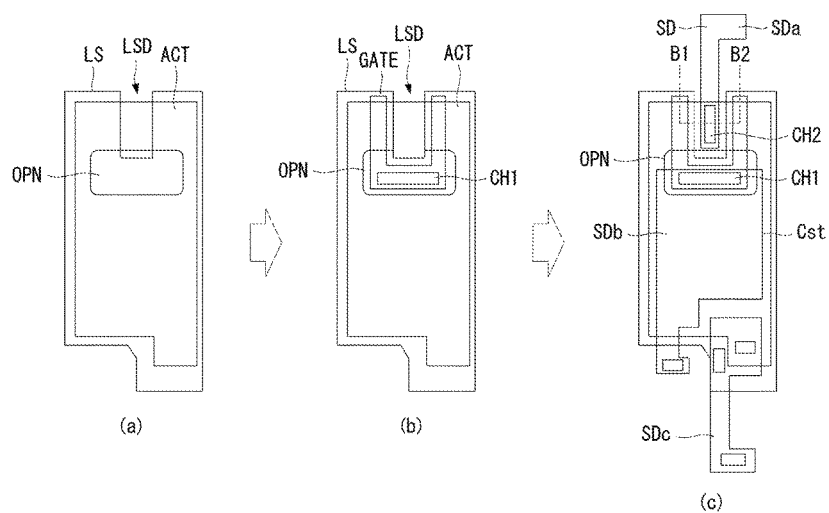
FIG. 8 is a plan view illustrating a circuit region of a subpixel to explain a first embodiment of the present disclosure.
Figure 9:
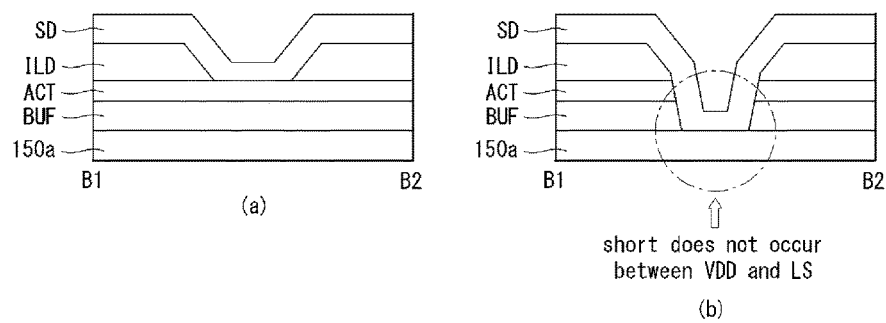
FIG. 9 is a cross-sectional view taken along line B1-B2 of FIG. 8.

FIG. 8 is a plan view illustrating a circuit region of a subpixel to explain a first embodiment of the present disclosure. FIG. 9 is a cross-sectional view taken along line B1-B2 of FIG. 8.

As illustrated in the FIG. 8 example, in a first embodiment, a process of forming a light blocking layer LS, a semiconductor layer ACT, a gate metal layer GATE, and a source/drain metal layer SD on a first substrate may be performed to form a driving transistor DR, a capacitor Cst, etc., in a circuit area. The semiconductor layer ACT may be selectively formed of indium gallium zinc oxide (IGZO), for example, but the present disclosure is not limited thereto.

As illustrated in part (a) of the examples of FIG. 8 and FIG. 9, after the light blocking layer LS is formed on the first substrate, a region (e.g., an overlap region between the LS and the SD), in which the source/drain metal layer SD and the semiconductor layer ACT may be electrically connected, may be removed. Accordingly, the light blocking layer LS may have a non-overlap region LSD as the region in which the source/drain metal layer SD and the semiconductor layer ACT may be electrically in contact, that was removed.

The non-overlap region LSD may correspond to a position of the second contact hole CH2. However, the non-overlap region LSD may occupy a region larger than the second contact hole CH2 in consideration of a process margin. Also, in the drawing, it is illustrated that the non-overlap region LSD may be positioned at an outer edge of one surface of an upper end of the light blocking layer LS, and may have a quadrangular (e.g., a rectangular) shape, for example, but the present disclosure is not limited thereto, and a position and a shape of the non-overlap region LSD may be modified to correspond to a contact structure.

The light blocking layer LS may be formed as a multi-layer structure. The light blocking layer LS may be formed as a triple layer structure including, for example, molybdenum (Mo) as a first layer, a transparent conducting oxide (TCO) as a second layer, and molybdenum (Mo) as a third layer. In an example in which TCO corresponds to the second layer, indium tin oxide (ITO), for example, may be selectively used, but the present disclosure is not limited thereto.

A buffer layer BUF may be formed on the light blocking layer, and a semiconductor layer ACT may be formed on the buffer layer. The semiconductor layer ACT may include an open part OPN. The open part OPN may be a region formed by removing the semiconductor layer ACT corresponding to a portion of a region in which the gate metal layer GATE is to be formed. The semiconductor layer ACT may be patterned to have a smaller and/or narrower area to lessen an influence of ambient light, although it may have a shape similar to that of the light blocking layer LS. After the formation of the semiconductor layer ACT, a process of performing a heat treatment at a high temperature may be performed.

As illustrated in part (b) of the examples of FIG. 8 and FIG. 9, a first insulating layer (not shown) may be formed on the semiconductor layer ACT, and a gate metal layer GATE may be formed on the first insulating layer. As illustrated, the gate metal layer GATE may have a "U" shape, but the present disclosure is not limited thereto. In a case in which the gate metal layer GATE has a "U" shape, it may be termed a "U-type" transistor.

To form the gate metal layer GATE in the illustrated form, an etching process may be performed after patterning, and a plasma process may be performed on the semiconductor layer ACT exposed to the periphery of the gate metal layer GATE to make it conductive. When the process of making the semiconductor layer ACT conductive is performed, the semiconductor layer ACT covered by the gate metal layer GATE may have semiconductor properties, while the semiconductor layer ACT exposed to the periphery of the gate metal layer GATE may have metal properties.

A second insulating layer ILD may be formed on the gate metal layer GATE, and a first contact hole CH1 exposing a portion of the gate metal layer GATE may be formed. The first contact hole CH1 may have a rectangular shape in which width is greater than a height, for example, but the present disclosure is not limited thereto.

As illustrated in part (c) of the examples of FIG. 8 and FIG. 9, a second contact hole CH2 may be formed on the second insulating layer, and a source/drain metal layer SD may be formed on the second insulating layer ILD. The source/drain metal layer SD may be formed from a material including, for example, copper (Cu), aluminum (Al), gold (Au), silver (Ag), titanium (Ti), molybdenum (Mo), tungsten (W), tantalum (Ta), or an alloy including one or more thereof. The aforementioned material may also be applied to the light blocking layer LS and the gate metal layer GATE.

The source/drain metal layer SD may be patterned and divided by region. The source/drain metal layer SD may be divided into a part SDb connected to the first contact hole CH1 to form a capacitor Cst, a part SDa connected to the second contact hole CH2 to be connected to the first power line, and a part SDc connected to the sensing transistor.

As illustrated in the FIG. 9 example, in the structure according to the first embodiment, even though over-etching may be made in a process of etching the second insulating layer ILD, a short does not occur between the light blocking layer LS and the source/drain metal layer SD. The reason is because the non-overlap region LSD may be prepared in the light blocking layer LS in consideration of problems, such as over-etching or an influence of a foreign object, that may arise during the process.

Figure 10:
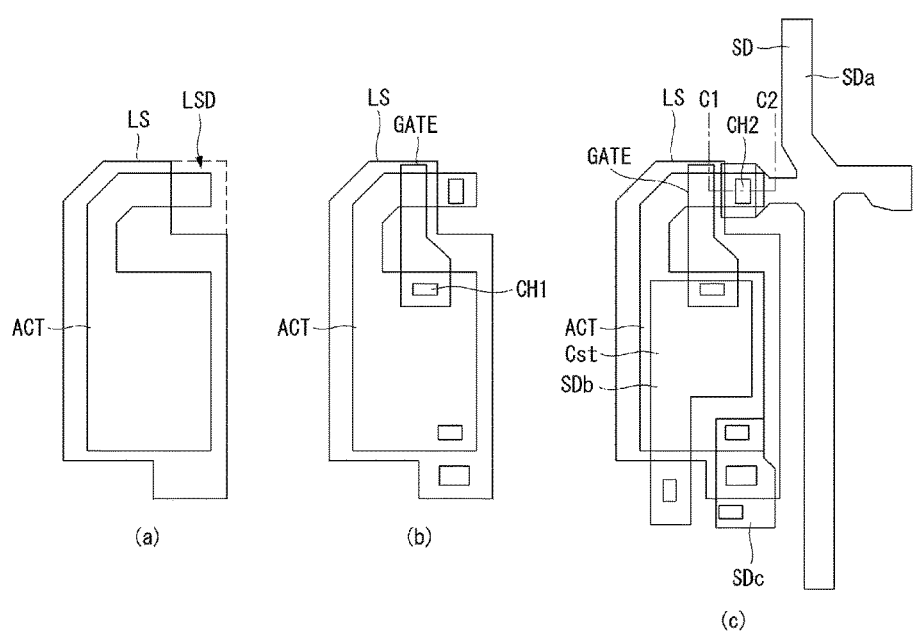
FIG. 10 is a plan view illustrating a circuit region of a subpixel to explain a second embodiment of the present disclosure.
Figure 11:
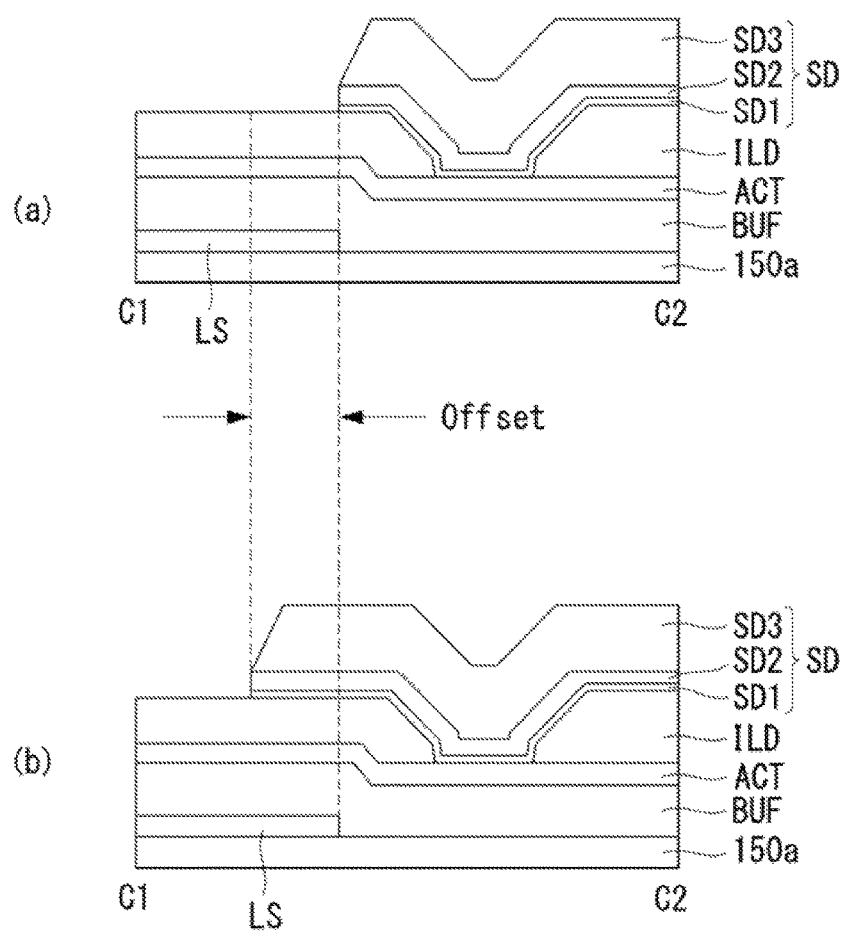
FIG. 11 is a cross-sectional view taken along line C1-C2 of FIG. 10.

FIG. 10 is a plan view illustrating a circuit region of a subpixel to explain a second embodiment of the present disclosure. FIG. 11 is a cross-sectional view taken along line C1-C2 of FIG. 10.

As illustrated in the examples of FIGS. 10 and 11, in the second embodiment, a process of forming a light blocking layer LS, a semiconductor layer ACT, a gate metal layer GATE, and a source/drain metal layer SD on a first substrate may be performed to form a driving transistor DR, a capacitor Cst, etc., within a circuit region. The semiconductor layer ACT may be selectively formed of IGZO, for example, but the present disclosure is not limited thereto.

As illustrated in part (a) of the examples of FIG. 10 and FIG. 11, after the light blocking layer LS is formed on the first substrate, a region (e.g., an overlap region between the LS and the SD), in which the source/drain metal layer SD and the semiconductor layer ACT may be electrically connected, may be removed. Accordingly, the light blocking layer LS may have a non-overlap region LSD as the region, in which the source/drain metal layer SD and the semiconductor layer ACT are electrically in contact, that was removed.

The non-overlap region LSD may correspond to a position of the second contact hole CH2. However, the non-overlap region LSD may occupy a region larger than the second contact hole CH2 in consideration of a process margin. Also, in the drawing, it is illustrated that the non-overlap region LSD may be positioned at an outer edge of one surface of an upper end of the light blocking layer LS and may have a quadrangular (e.g., a rectangular) shape, for example, but the present disclosure is not limited thereto, and a position and a shape of the non-overlap region LSD may be modified to correspond to a contact structure.

A buffer layer BUF may be formed on the light blocking layer, and a semiconductor layer ACT may be formed on the buffer layer. The semiconductor layer ACT may be patterned to have a smaller and narrower area to lessen an influence of ambient light, although it may have a shape similar to that of the light blocking layer LS.

As illustrated in part (b) of the examples of FIG. 10 and FIG. 11, a first insulating layer (not shown) is formed on the semiconductor layer ACT, and a gate metal layer GATE is formed on the first insulating layer. As illustrated, the gate metal layer GATE may have an "I" shape, e.g., a "|" shape, but the present disclosure is not limited thereto. In a case in which the gate metal layer GATE has the "I" shape, it may be termed a "bar-type" transistor.

To form the gate metal layer GATE in the illustrated form, an etching process may be performed after patterning, and a plasma process may be performed on the semiconductor layer ACT exposed to the periphery of the gate metal layer GATE to make it conductive. When the process of making the semiconductor layer ACT conductive is performed, the semiconductor layer ACT covered by the gate metal layer GATE may have semiconductor properties, while the semiconductor layer ACT exposed to the periphery of the gate metal layer GATE may have metal properties.

A second insulating layer ILD may be formed on the gate metal layer GATE, and a first contact hole CH1 exposing a portion of the gate metal layer GATE may be formed. The first contact hole CH1 may have a quadrangular shape, for example, but the present disclosure is not limited thereto.

As illustrated in part (c) of the examples of FIG. 10 and FIG. 11, a second contact hole CH2 may be formed on the second insulating layer, and a source/drain metal layer SD may be formed on the second insulating layer ILD. The source/drain metal layer SD may be formed from a material including, for example, copper (Cu), aluminum (Al), gold (Au), silver (Ag), titanium (Ti), molybdenum (Mo), tungsten (W), tantalum (Ta), or an alloy including one or more thereof. The aforementioned material may also be applied to the light blocking layer LS and the gate metal layer GATE.

The source/drain metal layer SD may be patterned and divided by region. The source/drain metal layer SD may be divided into a part SDb connected to the first contact hole CH1 to form a capacitor Cst, a part SDa connected to the second contact hole CH2 to be connected to the first power line, and a part SDc connected to the sensing transistor.

As illustrated in the FIG. 11 example, in the structure according to the second embodiment, even though over-etching may be made in a process of etching the second insulating layer ILD, a short does not occur between the light blocking layer LS and the source/drain metal layer SD. The reason is because the non-overlap region LSD may be prepared in the light blocking layer LS in consideration of problems, such as over-etching or an influence of a foreign object, that may arise during the process.

In a case in which the non-overlap region LSD is prepared in the light blocking layer LS, NBTiS characteristics may be degraded due to an influence of ambient light. Thus, in the second embodiment, a low reflectivity layer may be added to the source/drain metal layer SD to form a multi-layer structure. The source/drain metal layer SD may be configured as M layers (where M is an integer≥2), including the low reflectivity layer. In the illustrated drawing, the source/drain metal layer SD including first to third layers (e.g., SD1, SD2, and SD3) is illustrated as an example, but embodiments are not limited thereto.

The low reflectivity layer included in the source/drain metal layer SD may absorb ambient light introduced upon being incident or reflected from a side surface. Thus, the use of the structure of the source/drain metal layer SD having the low reflectivity layer may improve the problem of the influence of ambient light and the degradation of the NBTiS characteristics that may occur when the non-overlap region LSD is formed in the light blocking layer. In addition, when the low reflectivity layer is added in configuring the source/drain metal layer SD, an offset may be adjusted to have a structure in which the source/drain metal layer SD does not overlap the light blocking layer LS as illustrated in part (a) of the FIG. 11 example, or a structure in which the source/drain metal layer SD overlaps the light blocking layer LS as illustrated in part (b) of the FIG. 11 example.

Figure 12:
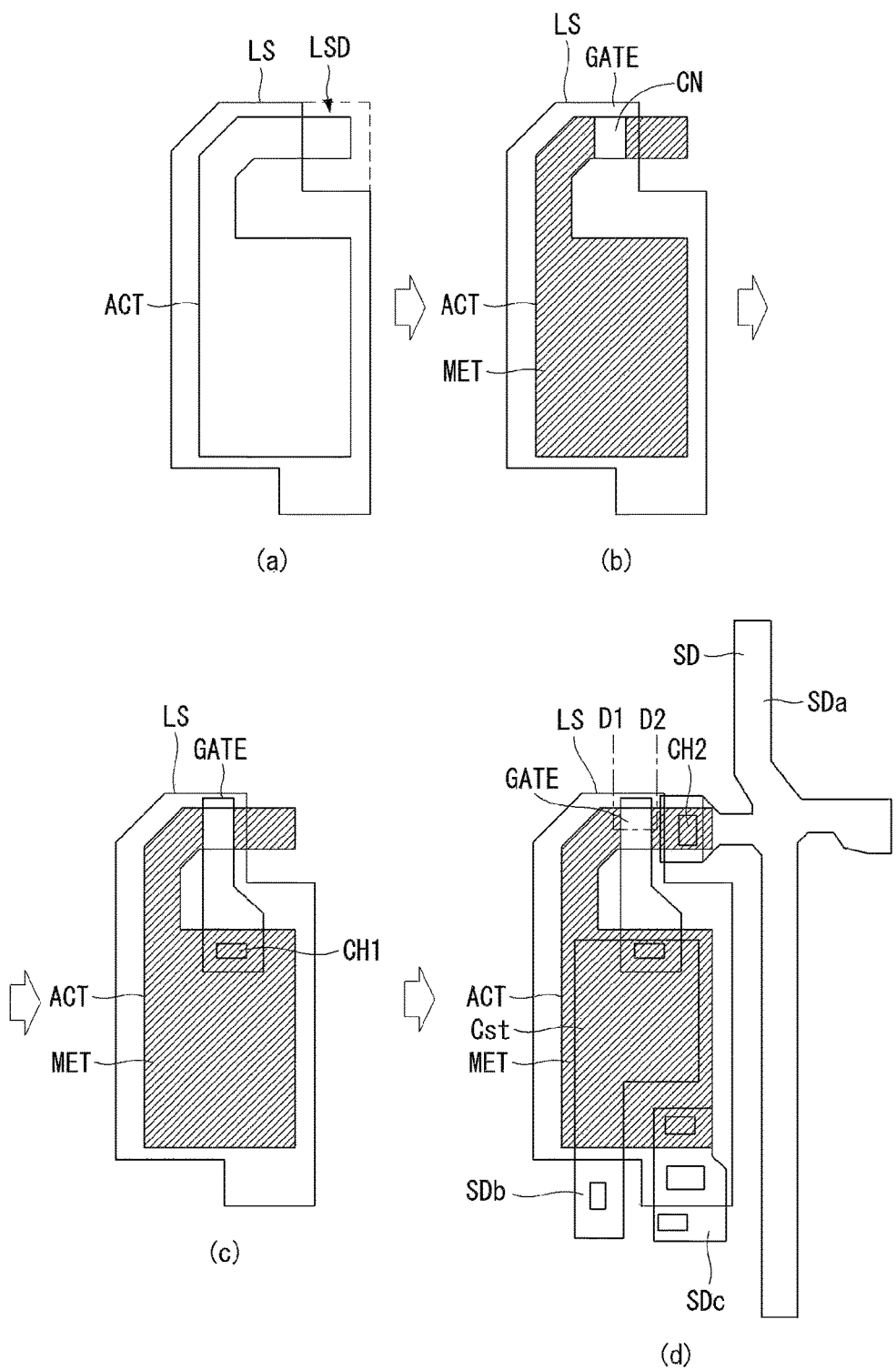
FIG. 12 is a plan view illustrating a circuit region of a subpixel to explain a third embodiment of the present disclosure.
Figure 13:
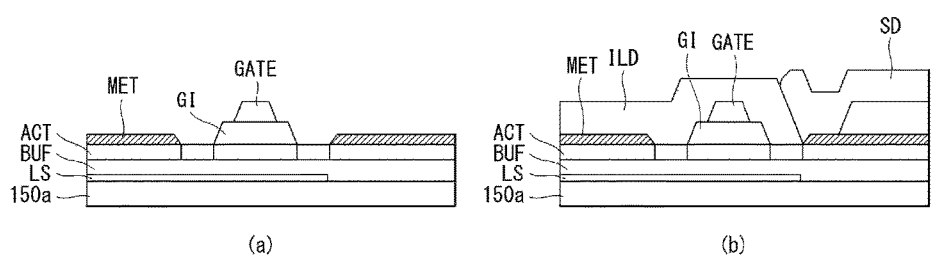
FIG. 13 is a cross-sectional view taken along line D1-D2 of FIG. 12.

FIG. 12 is a plan view illustrating a circuit region of a subpixel to explain a third embodiment of the present disclosure. FIG. 13 is a cross-sectional view taken along line D1-D2 of FIG. 12.

As illustrated in the examples of FIGS. 12 and 13, in the third embodiment, a process of forming a light blocking layer LS, a semiconductor layer ACT, a dummy metal layer MET, a gate metal layer GATE, and a source/drain metal layer SD on a first substrate may be performed to form a driving transistor DR, a capacitor Cst, etc., within a circuit region. The semiconductor layer ACT may be selectively formed of IGZO, for example, but the present disclosure is not limited thereto.

As illustrated in part (a) of the examples of FIG. 12 and FIG. 13, after the light blocking layer LS is formed on the first substrate, a region (e.g., an overlap region between the LS and the SD), in which the source/drain metal layer SD and the semiconductor layer ACT may be electrically connected, may be removed. Accordingly, the light blocking layer LS may have a non-overlap region LSD as the region, in which the source/drain metal layer SD and the semiconductor layer ACT are electrically in contact, that was removed.

The non-overlap region LSD may correspond to a position of the second contact hole CH2. However, the non-overlap region LSD may occupy a region larger than the second contact hole CH2 in consideration of a process margin. Also, in the drawing, it is illustrated that the non-overlap region LSD is positioned at an outer edge of a side surface of an upper end of the light blocking layer LS and has a rectangular shape, for example, but the present disclosure is not limited thereto, and a position and a shape of the non-overlap region LSD may be modified to correspond to a contact structure.

A buffer layer BUF may be formed on the light blocking layer, and a semiconductor layer ACT may be formed on the buffer layer. The semiconductor layer ACT may be patterned to have a smaller and narrower area to lessen an influence of ambient light, although it may have a shape similar to that of the light blocking layer LS.

As illustrated in part (b) of the examples of FIG. 12 and FIG. 13, a dummy metal layer MET may be formed on the semiconductor layer ACT, and may be patterned to be electrically contact with the semiconductor layer ACT, excluding a region of the semiconductor layer ACT corresponding to a channel region CN of the semiconductor layer ACT. The dummy metal layer MET may be formed of a material including, e.g., molybdenum (Mo), titanium (Ti), zirconium (Zr), tantalum (Ta), tungsten (W), manganese (Mn), vanadium (V), niobium (Nb), iron (Fe), cobalt (Co), nickel (Ni), or an alloy including one or more thereof.

The dummy metal layer MET may have a shape corresponding to the semiconductor layer ACT, except for the region thereof corresponding to the channel region CN of the semiconductor layer ACT. The structure of the semiconductor layer ACT and the dummy metal layer MET may have low reflectivity characteristics. When the dummy metal layer MET is formed on the semiconductor layer ACT, processability may be enhanced by reducing a conductive region. Also, an ambient light absorption path of the semiconductor layer ACT may be blocked. Also, the semiconductor layer ACT and the dummy metal layer MET may be collectively etched through a half-tone process.

As illustrated in part (c) of the examples of FIG. 12 and FIG. 13, a first insulating layer GI on the dummy metal layer MET, and a gate metal layer GATE is formed on the first insulating layer GI. As illustrated, the gate metal layer GATE may have an "I" shape, e.g., a "|" shape, but the present disclosure is not limited thereto. In a case in which the gate metal layer GATE has the "I" shape, it may be termed a "bar-type" transistor.

To form the gate metal layer GATE in the illustrated form, an etching process may be performed after patterning, and a plasma process may be performed on the semiconductor layer ACT exposed to the periphery of the gate metal layer GATE to make it conductive. When the process of making the semiconductor layer ACT conductive is performed, the semiconductor layer ACT covered by the gate metal layer GATE may have semiconductor properties, while the semiconductor layer ACT exposed to the periphery of the gate metal layer GATE may have metal properties.

A second insulating layer ILD may be formed on the gate metal layer GATE, and a first contact hole CH1 exposing a portion of the gate metal layer GATE may be formed. The first contact hole CH1 may have a quadrangular shape, for example, but the present disclosure is not limited thereto.

As illustrated in part (d) of the examples of FIG. 12 and FIG. 13, a second contact hole CH2 may be formed on the second insulating layer, and a source/drain metal layer SD may be formed on the second insulating layer ILD. The source/drain metal layer SD may be formed from a material including, e.g., copper (Cu), aluminum (Al), gold (Au), silver (Ag), titanium (Ti), molybdenum (Mo), tungsten (W), tantalum (Ta), or an alloy including one or more thereof. The aforementioned material may also be applied to the light blocking layer LS and the gate metal layer GATE.

The source/drain metal layer SD may be patterned and divided by region. The source/drain metal layer SD may be divided into a part SDb connected to the first contact hole CH1 to form a capacitor Cst, a part SDa connected to the second contact hole CH2 to be connected to the first power line, and a part SDc connected to the sensing transistor.

As in the first and second embodiments, similarly, in the third embodiment, even though over-etching may be made in a process of etching the second insulating layer ILD, a short does not occur between the light blocking layer LS and the source/drain metal layer SD. The reason is because the non-overlap region LSD may be prepared in the light blocking layer LS in consideration of problems, such as over-etching or an influence of a foreign object, that may arise during the process.

In a case in which the non-overlap region LSD is prepared in the light blocking layer LS, NBTiS characteristics may be degraded due to an influence of ambient light. Thus, in the third embodiment, the dummy metal layer MET may be deposited together on the semiconductor layer ACT, excluding the region corresponding to the channel region CN of the semiconductor layer ACT, to block a movement path of ambient light.

The dummy metal layer MET may absorb light that comes after being incident or reflected from a side surface. Thus, the use of the dummy metal layer MET may improve the problem of the influence of ambient light and the degradation of the NBTiS characteristics that may occur when the non-overlap region LSD is formed in the light blocking layer.

As can be seen from the first to third embodiments of the present disclosure, the source/drain metal layer SD electrically connected through the contact hole may be patterned, e.g., in a vertical direction or in a horizontal direction. Thus, the non-overlap region LSD of the light blocking layer LS may be formed in various positions and shapes.

The display panel described above may be applied to a general transistor structure such as a bottom gate, a double gate, or a coplanar structure. Also, the display panel described above may be implemented in a top emission, bottom emission, a dual emission manner. Also, the transistor described above may also be applied to a transistor implemented based on any other semiconductor material, as well as the oxide transistor. Meanwhile, in the first to third embodiments described above, a light blocking layer described hereinafter may be used.

Figure 14:
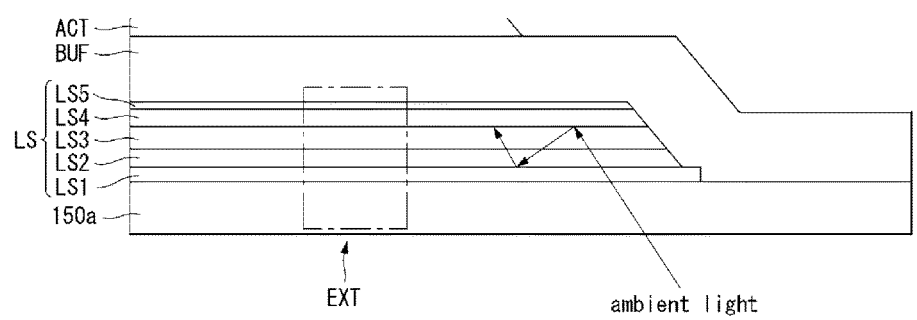
FIG. 14 is a view illustrating a structure of a light blocking layer according to a first example.
Figure 15:
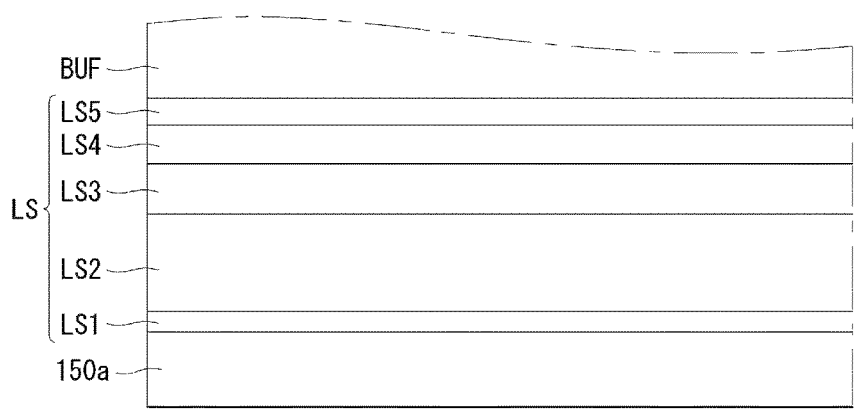
FIG. 15 is an enlarged view of the region EXT of FIG. 14.
Figure 16:
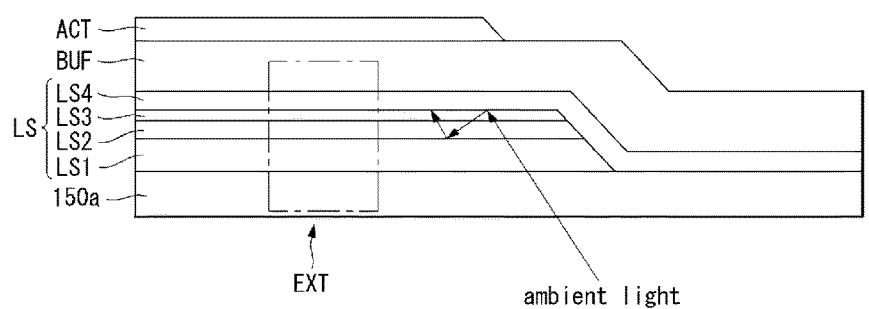
FIG. 16 is a view illustrating a structure of a light blocking layer according to a second example.
Figure 17:
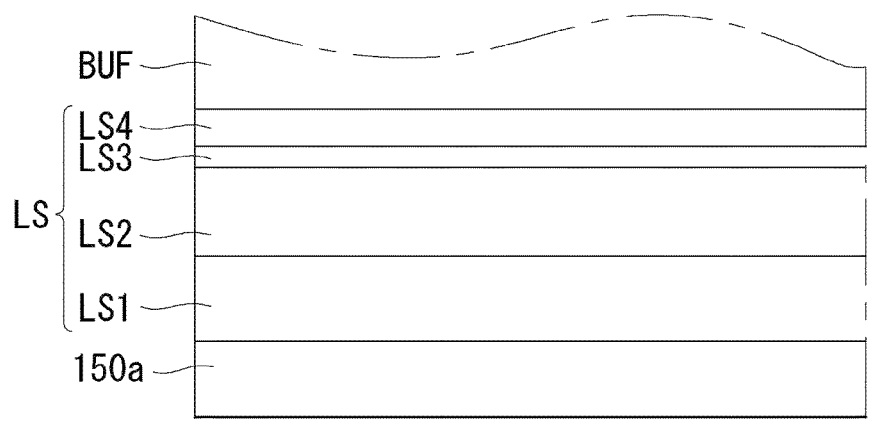
FIG. 17 is an enlarged view of the region EXT of FIG. 16.
Figure 18:
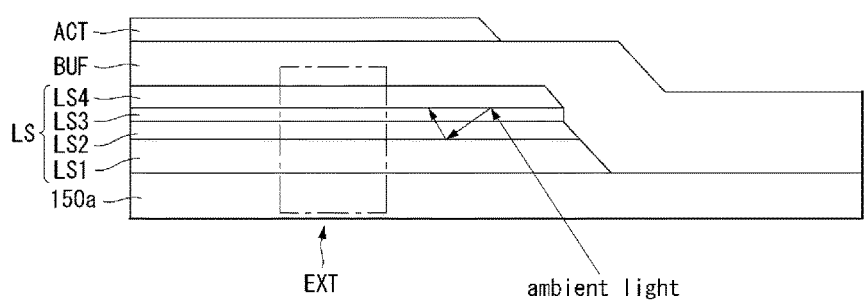
FIG. 18 is a view illustrating a structure of a light blocking layer according to a third example.
Figure 19:
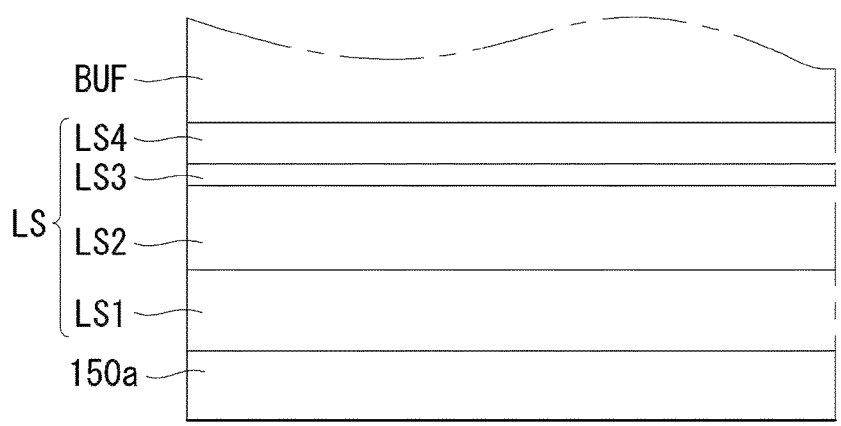
FIG. 19 is an enlarged view of the region EXT of FIG. 18.

FIG. 14 is a view illustrating a structure of a light blocking layer according to a first example. FIG. 15 is an enlarged view of the region EXT of FIG. 14. FIG. 16 is a view illustrating a structure of a light blocking layer according to a second example. FIG. 17 is an enlarged view of the region EXT of FIG. 16. FIG. 18 is a view illustrating a structure of a light blocking layer according to a third example. FIG. 19 is an enlarged view of the region EXT of FIG. 18.

As illustrated in a first example of FIGS. 14 and 15, a light blocking layer LS may include first to fifth layers LS1 to LS5. For example, the light blocking layer LS may be formed as a five-layer film including, e.g., molybdenum (Mo) as a first layer, indium tin oxide (ITO) as a second layer, molybdenum (Mo) as a third layer, molybdenum titanium (MoTi) as a fourth layer, and titanium dioxide (TiO$_2$) as a fifth layer. However, when the film of titanium dioxide (TiO$_2$) is not formed, the light blocking layer LS may be formed as a four-layer film including, e.g., molybdenum (Mo) as a first layer, indium tin oxide (ITO) as a second layer, molybdenum (Mo) as a third layer, and molybdenum titanium (MoTi) as a fourth layer.

A buffer layer BUF formed on the light blocking layer LS may be selectively formed of silicon dioxide (SiO$_2$), for example. Here, however, adhesion between molybdenum (Mo) and silicon dioxide (SiO$_2$) may not be sufficient. Thus, titanium (Ti) or molybdenum titanium (MoTi) may be added as a fourth layer LS4 to Mo as a third layer LS3 to obtain better adhesion. In this connection, molybdenum titanium (MoTi) positioned above may improve adhesion with respect to silicon dioxide (SiO$_2$) when a high temperature process is performed, and molybdenum (Mo) may restrain reactivity with respect to indium tin oxide (ITO). Also, molybdenum titanium (MoTi) has excellent ability of absorbing light, so it may further lessen an influence of ambient light.

As illustrated in a second example of FIGS. 16 and 17, a light blocking layer LS may include first to fourth layers LS1 to LS4. For example, the light blocking layer LS may be formed as a four-layer film including molybdenum (Mo) as a first layer, indium tin oxide (ITO) as a second layer, molybdenum (Mo) as a third layer, and a silicon nitride (SiN$_x$) as a fourth layer.

A buffer layer BUF formed on the light blocking layer LS may be selectively formed of silicon dioxide (SiO$_2$), for example. Here, however, adhesion between molybdenum (Mo) and silicon dioxide (SiO$_2$) may not be sufficient. Thus, silicon nitride (SiN$_x$) may be added as a fourth layer LS4 to molybdenum (Mo) as a third layer LS3 to obtain better adhesion. In this connection, silicon nitride (SiN$_x$) may improve adhesion with respect to silicon dioxide (SiO$_2$), and may strengthen ability of absorbing light to lessen an influence of ambient light.

As illustrated in a third example of FIGS. 18 and 19, a light blocking layer LS may include first to fourth layers LS1 to LS4. For example, the light blocking layer LS may be formed as a four-layer film including molybdenum (Mo) as a first layer, indium tin oxide (ITO) as a second layer, molybdenum (Mo) as a third layer, and indium tin oxide (ITO) as a fourth layer.

A buffer layer BUF formed on the light blocking layer LS may be selectively formed of silicon dioxide (SiO$_2$), for example. Here, however, adhesion between molybdenum (Mo) and silicon dioxide (SiO$_2$) may not be sufficient. Thus, indium tin oxide (ITO) may be added as a fourth layer LS4 to molybdenum (Mo) as a third layer LS3 to obtain better adhesion. In this connection, indium tin oxide (ITO) may improve adhesion with respect to silicon dioxide (SiO$_2$), and may strengthen ability of absorbing light to lessen an influence of ambient light.

Meanwhile, as a low reflectivity material added to the third layer of the light blocking layer LS may include, e.g., titanium (Ti), zirconium (Zr), hafnium (Hf), vanadium (V), niobium (Nb), tantalum (Ta), chromium (Cr), tungsten (W), or an alloy including one or more thereof. The first to third examples above may be applied to one or more selected from among the gate metal layer, the dummy metal layer, and the source/drain metal layer described above in the embodiments.

It will be apparent to those skilled in the art that various modifications and variations may be made in the present disclosure without departing from the spirit or scope of the invention. Thus, it is intended that embodiments of the present disclosure cover the modifications and variations of this invention provided they come within the scope of the appended claims and their equivalents.

What is claimed is:
1. A display device, comprising:
    a light blocking layer on a first substrate;
    a buffer layer on the light blocking layer;
    a semiconductor layer on the buffer layer;
    a dummy metal layer on and directly contacting the semiconductor layer, the dummy metal layer including an opening exposing an entirety of a channel region of the semiconductor layer;
    an insulating layer on the semiconductor layer in the opening and not directly contacting the dummy metal layer;
    a source/drain metal layer on the insulating layer, the source/drain metal layer comprising a non-overlap region that does not overlap the light blocking layer, and overlaps the semiconductor layer; and
    a gate metal layer on the insulating layer,
    wherein no portion of the dummy metal layer overlaps the gate metal layer in any part of the channel region of the semiconductor layer.

2. The display device of claim 1, wherein the non-overlap region has a size greater than or equal to a size of a region in which the semiconductor layer and the source/drain metal layer are electrically connected.

3. The display device of claim 1, wherein the non-overlap region:
    is at an outer edge of one surface of an upper end of the light blocking layer; and
    has a quadrangular shape.

4. The display device of claim 1, wherein the non-overlap region:
    is on an outer edge of a side surface of an upper end of the light blocking layer; and
    has a quadrangular shape.

5. The display device of claim 1, wherein the non-overlap region is in a region adjacent to an insulated gate metal layer on the semiconductor layer.

6. The display device of claim 1, wherein at least one of the light blocking layer, the gate metal layer, and the source/drain metal layer comprises multiple layers comprising a light-absorbing layer.

7. The display device of claim 3, wherein the light blocking layer faces the non-overlap region on three sides in plan view.

8. The display device of claim 4, wherein the light blocking layer faces the non-overlap region on three sides in plan view.

9. The display device of claim 1, wherein the dummy metal layer has a shape corresponding to the semiconductor layer, except for the region corresponding to the channel region of the semiconductor layer.

10. The display device of claim 1, further comprising:
    a contact hole in the insulating layer,
    wherein a position of the contact hole corresponds to the non-overlap region.

11. The display device of claim 10, wherein the non-overlap region occupies a region larger than the contact hole.

12. The display device of claim 1, wherein the source/drain metal layer directly contacts the dummy metal layer.

* * * * *